United States Patent
Jennings et al.

(10) Patent No.: US 12,250,771 B2
(45) Date of Patent: Mar. 11, 2025

(54) CAPACITOR BANK ASSEMBLY

(71) Applicant: Rockwell Collins, Inc., Cedar Rapids, IA (US)

(72) Inventors: Martin J. Jennings, Oxford, IA (US); Justin R. Dewald, Vinton, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 230 days.

(21) Appl. No.: 17/870,063

(22) Filed: Jul. 21, 2022

(65) Prior Publication Data

US 2024/0032198 A1   Jan. 25, 2024

(51) Int. Cl.
| | | |
|---|---|---|
| H05K 1/18 | (2006.01) |
| H05K 1/02 | (2006.01) |
| H05K 1/11 | (2006.01) |
| H05K 3/32 | (2006.01) |

(52) U.S. Cl.
CPC ............ *H05K 1/181* (2013.01); *H05K 1/0277* (2013.01); *H05K 1/111* (2013.01); *H05K 3/32* (2013.01); *H05K 2201/10015* (2013.01); *H05K 2201/10545* (2013.01)

(58) Field of Classification Search
CPC ...... H05K 1/181; H05K 1/0277; H05K 1/111; H05K 3/32; H05K 2201/10015; H05K 2201/10545
USPC ......................................................... 361/768
See application file for complete search history.

(56) References Cited

U.S. PATENT DOCUMENTS

| | | |
|---|---|---|
| 5,448,511 A | 9/1995 | Paurus et al. |
| 9,025,311 B1 | 5/2015 | Bultitude et al. |
| 9,288,906 B2 | 3/2016 | Lee et al. |
| 9,520,239 B2 | 12/2016 | Park et al. |
| 9,723,713 B1 | 8/2017 | Vrtis et al. |
| 9,788,789 B2 | 10/2017 | Bailey |
| 9,980,383 B2 | 5/2018 | Yosui et al. |
| 11,285,700 B2 | 3/2022 | Yoneda |
| 2003/0080438 A1* | 5/2003 | Matsuura ............... H05K 1/147 257/E25.023 |
| 2007/0184719 A1* | 8/2007 | Ni ........................ H05K 5/0278 439/607.41 |
| 2012/0139483 A1 | 6/2012 | Cottet |
| 2015/0270065 A1 | 9/2015 | Hattori et al. |
| 2016/0126011 A1 | 5/2016 | Schmit et al. |

(Continued)

FOREIGN PATENT DOCUMENTS

DE     2430666 A1    1/1976

OTHER PUBLICATIONS

Extended European Search Report dated Dec. 14, 2023; European Application No. 23186824.1.

*Primary Examiner* — Andargie M Aychillhum

(74) *Attorney, Agent, or Firm* — Suiter Swantz IP

(57) ABSTRACT

A capacitor bank includes a printed circuit board adapted for a first capacitor disposed on a first surface of the printed circuit board and a second capacitor disposed on a second, opposing surface of the printed circuit board. The first and second capacitor are connected to the printed circuit board at surface mounts pads on opposing sides of the printed circuit board that may be in electronic communication with each other. The capacitors may be connected in series or parallel. Multiple printed circuit boards with capacitors on opposing surfaces may include flexible printed circuit board portions to allow the capacitor bank to be folded into an available space.

17 Claims, 4 Drawing Sheets

(56) References Cited

U.S. PATENT DOCUMENTS

| | | | |
|---|---|---|---|
| 2016/0173011 A1* | 6/2016 | Adra | H02P 3/065 |
| | | | 318/380 |
| 2016/0211075 A1* | 7/2016 | Park | H01G 4/38 |
| 2017/0196092 A1* | 7/2017 | Choi | H01G 4/224 |
| 2019/0296658 A1* | 9/2019 | Chung | H02M 7/003 |
| 2020/0209355 A1* | 7/2020 | Pacala | G01S 7/484 |
| 2021/0074480 A1* | 3/2021 | Sim | H01G 4/232 |
| 2021/0098192 A1 | 4/2021 | Leary et al. | |

* cited by examiner

CAPACITOR BANK ASSEMBLY

BACKGROUND

Capacitors can be arranged in either parallel or series configurations that result in differing bulk characteristics to create configurations of capacitors that achieve a voltage rating and bulk capacitance, among other characteristic, for a desired implementation. To achieve a desired performance, the physical arrangement of capacitors can become quite large. Industries such as military avionics equipment require rugged, high-capacity capacitor configurations to provide the necessary hold-up and filtering for top-level (T/L) line replaceable units (LRU).

Traditional capacitors are constructed in a cylindrical-form which occupies a considerable amount of volume within the T/L, making it difficult to efficiently package devices within the LRU. While these capacitors provide good capacitance values and adequate voltage ratings, their overall volume often prevents them from being installed in units with limited available space. Furthermore, traditional capacitor construction is susceptible to fatigue damage from vibrations resulting in lost or degraded performance.

Alternative capacitor technologies include ultra-dense cubes intended for direct placement on a printed circuit board (PCB) of a circuit card assembly. This installation is accomplished with through-hole leads or surface-mount soldering of the capacitors to the card. While such configurations are volumetrically efficient, many circuit cards are not compatible for mounting an array (parallel or series capacitor arrangement) of these devices.

SUMMARY

In one aspect, embodiments of the inventive concepts disclosed herein are directed to a capacitor bank having a printed circuit board adapted for a first capacitor disposed on a first surface of the printed circuit board and a second capacitor disposed on a second, opposing surface of the printed circuit board. The first and second capacitor are connected to the printed circuit board at surface mounts pads on opposing sides of the printed circuit board. The capacitors may be connected in series or parallel.

In a further aspect, multiple printed circuit boards with capacitors on opposing surfaces may include flexible printed circuit board portions to allow the capacitor bank to be folded into an available space.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
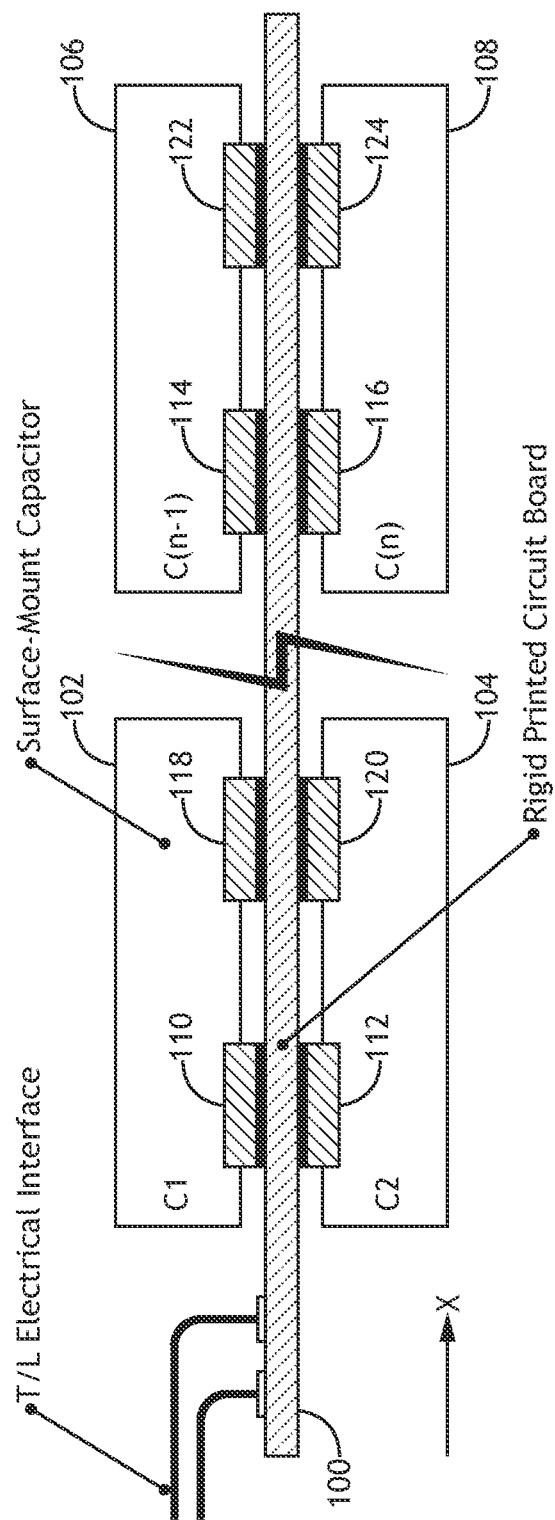
FIG. 1 shows a side view of a capacitor bank according to an exemplary embodiment.

Before explaining various embodiments of the inventive concepts disclosed herein in detail, it is to be understood that the inventive concepts are not limited in their application to the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of a feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Also, while various components may be depicted as being connected directly, direct connection is not a requirement. Components may be in data communication with intervening components that are not illustrated or described.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in at least one embodiment" in the specification does not necessarily refer to the same embodiment. Embodiments of the inventive concepts disclosed may include one or more of the features expressly described or inherently present herein, or any combination or sub-combination of two or more such features.

Broadly, embodiments of the inventive concepts disclosed herein are directed to a capacitor bank having a printed circuit board adapted for a first capacitor disposed on a first surface of the printed circuit board and a second capacitor disposed on a second, opposing surface of the printed circuit board. The first and second capacitor are connected to the printed circuit board at surface mounts pads on opposing sides of the printed circuit board. The capacitors may be connected in series or parallel. Multiple printed circuit boards with capacitors on opposing surfaces may include flexible printed circuit board portions to allow the capacitor bank to be folded into an available space.

Referring to FIG. 1, a side view of a capacitor bank according to an exemplary embodiment is shown. The capacitor bank comprises a PCB 100 and a plurality of capacitors 102, 104, 106, 108. The capacitors 102, 104, 106, 108 may be surface mount capacitors affixed to the PCB 100 via contact elements 110, 112, 114, 116, 118, 120, 122, 124 attached to contact interfaces defined on the PCB 100. At least one contact interface may define a pad on a top surface of the PCB 100 and a pad bottom surface of the PCB 100 in electronic communication with each other. For example, a contact interface may comprise a via through the PCB 100 or a metalized element wrapping around the PCB 100.

The capacitors 102, 104, 106, 108 are affixed to both the top surface of the PCB 100 and the bottom surface of the PCB 100. In at least one embodiment, capacitors 102, 104, 106, 108 are attached to pads on their corresponding surfaces; one or more pads on opposing surfaces may be in electronic communication with each other. For example, a first capacitor 102 is attached to pads on the top surface of the PCB 100 and a second capacitor 104 is attached to pads on the bottom surface of the PCB 100. The first capacitor 102 and second capacitor 104 are in electronic communication via at least one contact element 110 of the first capacitor 102 and at least one contact element 112 of the second capacitor 104, each attached to a pads in electronic communication. In at least one embodiment, the first capacitor 102 and second capacitor 104 may also be in electronic communication via second contact elements 118, 120 of each capacitor 102, 104.

The first capacitor 102 and second capacitor 104 may be connected in series or in parallel depending on the interconnection of the corresponding contact elements 110, 112 and electronic paths defined on the PCB 100. In at least one embodiment, strings of capacitors 102, 104, 106, 108 may be connected via sets of pads on opposing sides of the PCB 100 in electronic communication. For example, a first capacitor 102 may be in electronic communication with a second capacitor 104 via a first set of pads, and the second capacitor 104 may be in electronic communication with a third capacitor 106 via a second set of pads.

Embodiments may provide some unused PCB area due to the physical geometry of the capacitors 102, 104, 106, 108. In at least one embodiment, the unused space on the PCB 100 may include elements and circuitry pertinent to the capacitor bank, such as voltage balancing components, capacitance tuning elements, resistors, transistors, and the like.

Figure 2:
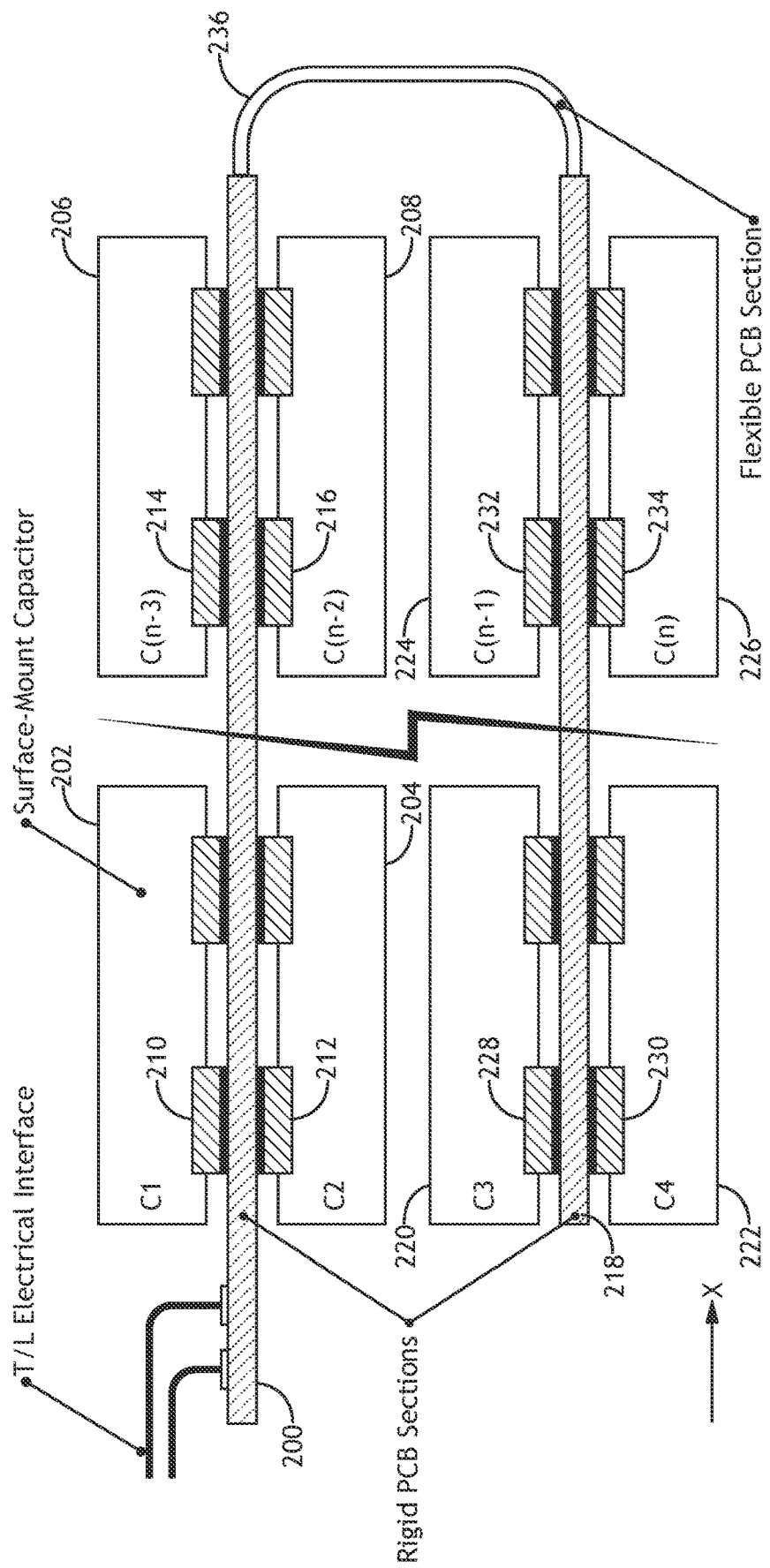
FIG. 2 shows a side view of a capacitor bank according to an exemplary embodiment.

Referring to FIG. 2, a side view of a capacitor bank according to an exemplary embodiment is shown. The capacitor bank comprises a first PCB 200 and a plurality of capacitors 202, 204, 206, 208 affixed to the first PCB 200 via contact elements 210, 212, 214, 216 attached to pads defined on the first PCB 200, including pads on opposing surfaces that may be in electronic communication. The pads in electronic communication put capacitors 202, 204, 206, 208 on the top surface and bottom surface in electronic communication. Capacitors 202, 204, 206, 208 on the first PCB 200 may be connected in series or in parallel depending on the interconnection of the corresponding contact elements 210, 212, 214, 216 and electronic paths defined on the first PCB 200. In at least one embodiment, strings of capacitors 202, 204, 206, 208 on the first PCB 200 may be connected via pads in electronic communication.

In at least one embodiment, the capacitor bank may include a second PCB 218 with a plurality of capacitors 220, 224, 222, 226. The second PCB 218 also defines pads in electronic communication such that the capacitors 220, 222, 224, 226 may be in electronic communication via at least one contact element 228, 230, 232, 234 of two or more capacitors 220, 224, 222, 226 attached to both the top surface of the second PCB 218 and the bottom surface of the PCB 218.

In at least one embodiment, the first PCB 200 and the second PCB 218 include a flexible PCB portion 236. The flexible PCB portion 236 allows the first PCB 200 and the second PCB 218 to be folded into a compact configuration for applications where a footprint for the capacitor bank is restricted but vertical space is available on a circuit card assembly.

Figure 3:
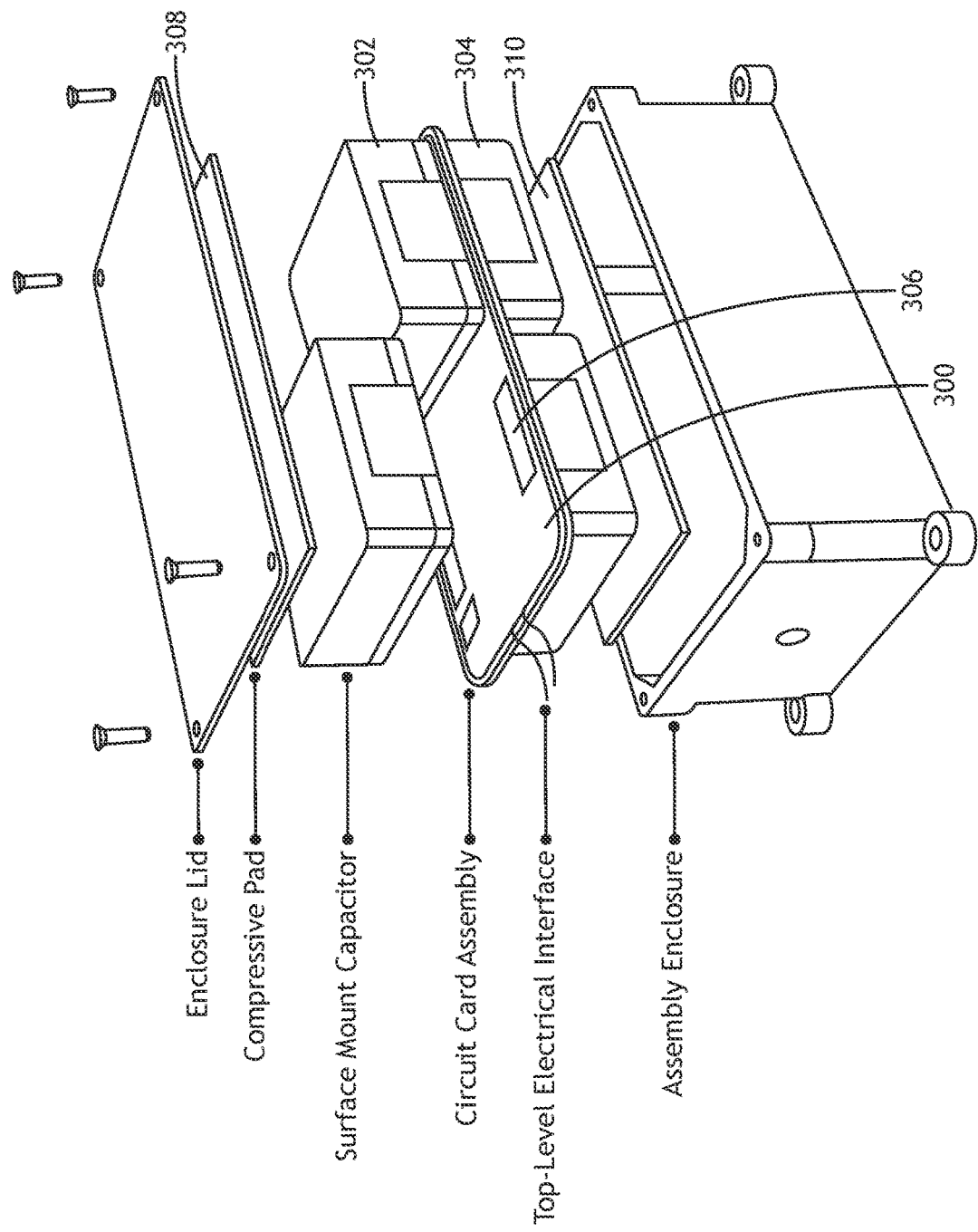
FIG. 3 shows a perspective, exploded view of a capacitor bank according to an exemplary embodiment.

Referring to FIG. 3, a perspective, exploded view of a capacitor bank according to an exemplary embodiment is shown. The capacitor bank may be compact as compared to existing capacitor banks where capacitors 302, 304 are attached to both the top surface of a PCB 300 and a bottom surface of the PCB 300. The capacitors 302, 304 may be in electronic communication via pads 306 on opposing surfaces of the PCB 300. The capacitors 302, 304 and PCB 300 may be encased in a substantially sealed enclosure. In at least one embodiment, compressive thermal interface pads 308, 310 may abut the capacitors 302, 304 to dampen vibrations and to facilitate cooling.

Figure 4:
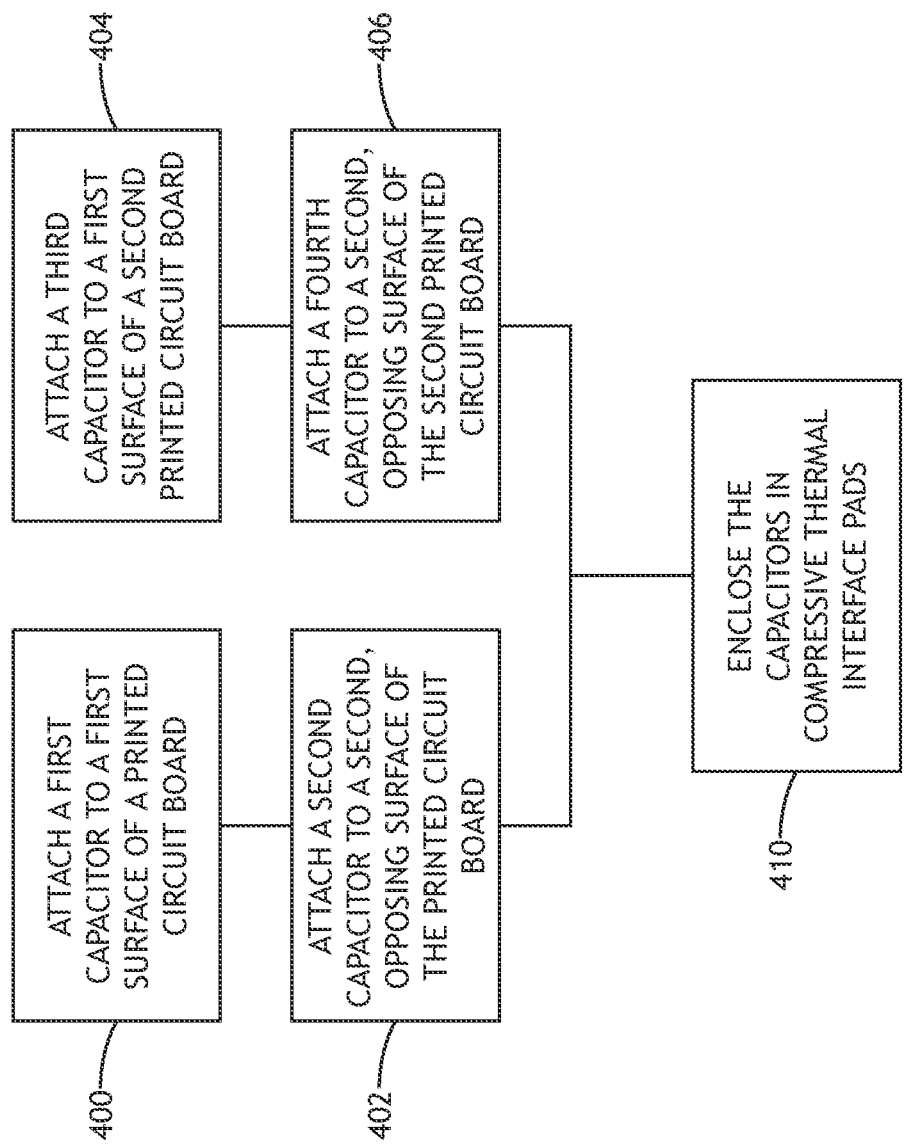
FIG. 4 shows a flowchart of a method for producing a capacitor bank according to an exemplary embodiment.

Referring to FIG. 4, a flowchart of a method for producing a capacitor bank according to an exemplary embodiment is shown. During manufacture, a first capacitor is attached 400 to a first surface of a first rigid PCB portion with at least one attachment at a pad providing electronic connectivity to both a top surface of the first rigid PCB portion and a bottom surface of the first rigid PCB portion. A second capacitor is attached 402 to a second surface of the first rigid PCB portion with at least one attachment at a corresponding pad providing electronic connectivity to both the top surface of the first rigid PCB portion and the bottom surface of the first rigid PCB portion. The first surface and second surface correspond to opposing sides of the first rigid PCB portion.

In at least one embodiment, a third capacitor is attached 404 to a first surface of a second rigid PCB portion at a pad providing electronic communication to a pad on an opposing side of the second rigid PCB portion, and a fourth capacitor is attached 406 to a second surface of the second rigid PCB portion at a corresponding pad. The PCB may include a flexible PCB portion connecting the first rigid PCB portion and the second rigid PCB portion, and the capacitor bank may be enclosed 410 in an enclosure with one or more compressive thermal interface pads.

It may be appreciated that while exemplary embodiments are described including a printed circuit board with rigid and flexible portions, separate rigid printed circuit boards in electronic communication via appropriate cables are also envisioned.

Embodiments of the present disclosure enable high density capacitor banks in varying T/L applications, and create a single hook-up location where a T/L assembly can utilize parallel or series capacitor bulk properties. Assembling the capacitors across a single PCB provides a very compact capacitor bank that previously would require a considerable amount of physical surface area. In addition, the surface-mounting of capacitors to a shared PCB removes the need for tedious hand-wiring or "daisy chaining" individual capacitors across a circuit.

Embodiments of the present disclosure enable a highly modular packaging. Depending on the space available within a T/L assembly, the footprint of the circuit card assembly may be scaled to increase the number of surface-mounted capacitors. Furthermore, in applications where there is space available, a rigid-flex-rigid PCB can be used to create a serpentine circuit card assembly with layers of capacitors.

Embodiments of the present disclosure enable remote installation of the capacitor bank within the LRU. Whereas traditional solutions require that the capacitor bank be installed directly on the circuit card assembly, the present disclosure allows the assembly to be mounted remotely within, or external to, the LRU.

It is believed that the inventive concepts disclosed herein and many of their attendant advantages will be understood by the foregoing description of embodiments of the inventive concepts, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The forms herein before described being merely explanatory embodiments thereof, it is the intention of the following claims to encompass and include such changes. Furthermore, any of the features disclosed in relation to any of the individual embodiments may be incorporated into any other embodiment.

What is claimed is:

1. A capacitor bank comprising:
   a printed circuit board;
   a plurality of capacitors;
   a voltage balancing component; and
   at least one capacitance tuning element,
   wherein:
      a first capacitor in the plurality of capacitors is disposed on a first surface of the printed circuit board;
      a second capacitor in the plurality of capacitors is disposed on a second surface of the printed circuit board opposite the first surface;
      the voltage balancing component and at least one capacitance tuning element are disposed on the printed circuit board, among the plurality of capacitors; and
      connection elements of the first capacitor and connection elements of the second capacitor each utilize at least one pad on the printed circuit board in electronic communication with each other via metallized elements disposed to wrap around the printed circuit board.

2. The capacitor bank of claim 1, wherein the first capacitor and second capacitor are connected in series.

3. The capacitor bank of claim 1, wherein the first capacitor and second capacitor are connected in parallel.

4. The capacitor bank of claim 1, wherein:
   the printed circuit board comprises a first rigid portion including the first capacitor and second capacitor, and further comprising a second rigid portion comprising:
      a third capacitor in the plurality of capacitors is disposed on a first surface of the second printed circuit board; and
      a fourth capacitor in the plurality of capacitors is disposed on a second surface of the second printed circuit board opposite the first surface; and
      connection elements of the third capacitor and connection elements of the fourth capacitor each utilize at least one pad on the second rigid portion in electronic communication with each other.

5. The capacitor bank of claim 4; further comprising a flexible printed circuit board section connecting the first rigid portion to the second rigid portion.

6. A method of producing a capacitor bank comprising:
   attaching a first capacitor to a first surface of a printed circuit board;
   attaching a second capacitor to a second surface of the printed circuit board opposite the first surface; and
   attaching a voltage balancing component and at least one capacitance tuning element on the printed circuit board, among the plurality of capacitors,
   wherein:
      connection elements of the first capacitor and connection elements of the second capacitor each utilize at least one pad on the printed circuit board in electronic communication with each other via metallized elements disposed to wrap around the printed circuit board.

7. The method of claim 6, further comprising aligning the first capacitor and second capacitor in series.

8. The method of claim 6, further comprising aligning the first capacitor and second capacitor in parallel.

9. The method of claim 6, further comprising:
   covering an external surface of the first capacitor with a first compressive thermal interface pad, the external surface opposite the printed circuit board; and
   covering an external surface of the second capacitor with a second compressive thermal interface pad, the external surface opposite the printed circuit board.

10. The method of claim 6, further comprising:
    attaching a third capacitor to a first surface of a second printed circuit board portion;
    attaching a fourth capacitor to a second surface of the second printed circuit board portion opposite the first surface,
    wherein:
       the first capacitor and second capacitor are disposed on a first printed circuit board portion of the printed circuit board; and
       connection elements of the third capacitor and connection elements of the fourth capacitor each utilize at least one pad on the second printed circuit board portion in electronic communication with each other.

11. The method of claim 10, wherein the printed circuit board comprises a flexible printed circuit board section connecting the first printed circuit board portion and the second printed circuit board portion.

12. A system comprising:
    a capacitor bank comprising:
       a printed circuit board;
       a plurality of capacitors;
       a voltage balancing component; and
       at least one capacitance tuning element,
       wherein:
          a first capacitor in the plurality of capacitors is disposed on a first surface of the printed circuit board;
          a second capacitor in the plurality of capacitors is disposed on a second surface of the printed circuit board opposite the first surface;

the voltage balancing component and at least one capacitance tuning element are disposed on the printed circuit board, among the plurality of capacitors; and connection elements of the first capacitor and connection elements of the second capacitor each utilize at least one pad on the printed circuit board in electronic communication with each other via metallized elements disposed to wrap around the printed circuit board.

13. The system of claim 12, wherein the first capacitor and second capacitor are connected in series.

14. The system of claim 12, wherein the first capacitor and second capacitor are connected in parallel.

15. The system of claim 12, further comprising:

a first compressive thermal interface pad disposed proximal to an external surface of the first capacitor, the external surface opposite the printed circuit board; and a second compressive thermal interface pad disposed proximal to an external surface of the second capacitor, the external surface opposite the printed circuit board.

16. The system of claim 12, wherein the capacitor bank comprises a first capacitor bank, further comprising:

a second capacitor bank comprising a printed circuit board, a first capacitor disposed on a first surface of the printed circuit board, and a second capacitor disposed on a second surface of the printed circuit board opposite the first surface, wherein connection elements of the first capacitor and connection elements of the second capacitor each utilize at least pad on the printed circuit board in electronic communication with each other.

17. The system of claim 16, further comprising a flexible printed circuit board section connecting the first capacitor bank to the second capacitor bank.

* * * * *